United States Patent
Marotta et al.

(12) 
(10) Patent No.: US 6,475,846 B1
(45) Date of Patent: Nov. 5, 2002

(54) METHOD OF MAKING FLOATING-GATE MEMORY-CELL ARRAY WITH DIGITAL LOGIC TRANSISTORS

(75) Inventors: Giulio Marotta, Contigliano; Giovanni Santin, S. Rufina, both of (IT); Michael C. Smayling, Missouri City; Misako A. Matsuoka, Plano, both of TX (US); Satoru Fukawa, Ibaraki-ken (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/444,182

(22) Filed: May 18, 1995

(51) Int. Cl.$^7$ .......................................... H01L 21/8238
(52) U.S. Cl. ........................ 438/201; 438/258; 438/275
(58) Field of Search .............................. 437/34, 43, 57, 437/58, 59, 149, 150, 151, 152; 438/201, 211, 258, 264, 275

(56) References Cited

U.S. PATENT DOCUMENTS 5,047,358 A * 9/1991 Kosiak et al. ................ 437/57
5,225,700 A * 7/1993 Smayling et al. ............. 437/43
5,411,908 A * 5/1995 Santin et al. ................. 437/43

* cited by examiner

Primary Examiner—Chandra Chaudhari
(74) Attorney, Agent, or Firm—W. James Brady; Frederick J. Telecky, Jr.

(57) ABSTRACT

A nonvolatile memory array is encased in a P-well, and the P-well encased in a deep N-well, the two wells separating the memory array from the integrated circuit substrate and from the other circuitry of the integrated circuit. At the same time the deep N-well is formed for the nonvolatile memory array, deep N-wells are formed for the high-voltage P-channel transistors of the logic circuitry. At the same time the P-well is formed for the nonvolatile memory array, P-wells are formed for the low-voltage N-channel transistors. The memory array contains nonvolatile cells of the type used in ultra-violet-erasable EPROMs. During erasure, the isolated-well formation allows the source, the drain and the channel of selected cells to be driven to a positive voltage. The isolated well is also driven to a positive voltage equal to, or slightly greater than, the positive voltage applied to the source and drain, thus eliminating the field-plate breakdown-voltage problem.

10 Claims, 5 Drawing Sheets

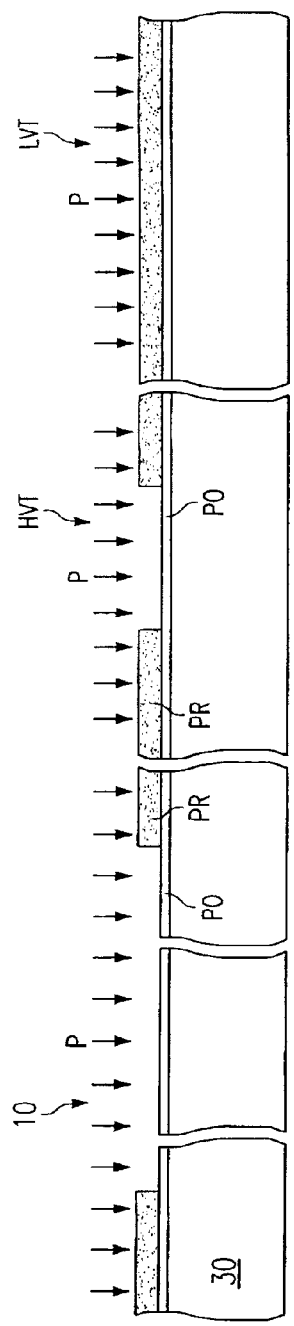 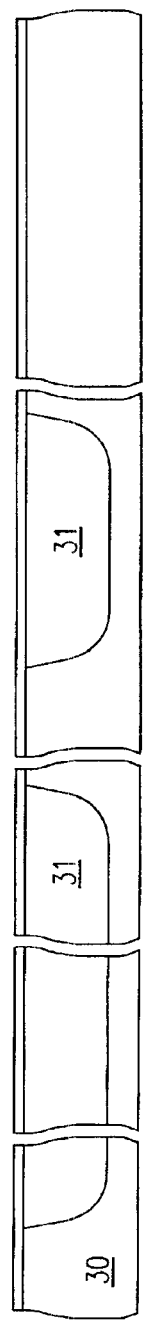 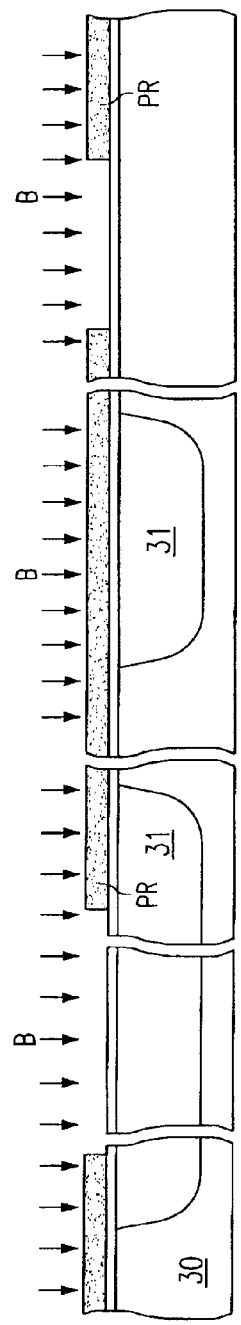 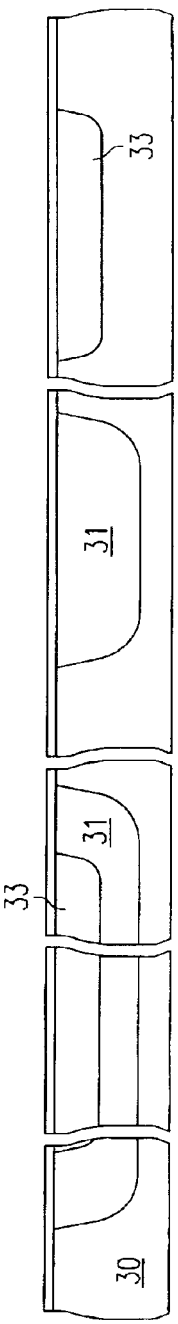
FIG. 3a
FIG. 3b
FIG. 3c
FIG. 3d

METHOD OF MAKING FLOATING-GATE MEMORY-CELL ARRAY WITH DIGITAL LOGIC TRANSISTORS

BACKGROUND OF THE INVENTION

This invention relates to nonvolatile semiconductor memory devices and, more particularly, to flash electrically erasable, programmable, read-only memories (flash EPROMs) having floating-gate-type memory cells and, more particularly, to a method of making such devices on a chip while at the same time making digital control circuitry.

An array structure using buried diffusion wells (tanks) is described in U.S. Pat. No. 5,411,908 issued May 2, 1995, and entitled "FLASH EEPROM ARRAY WITH P-TANK INSULATED FROM SUBSTRATE BY DEEP N-TANK". That patent is assigned to Texas Instruments Incorporated.

The prior-art includes programming and erasing floating-gate memory cells by Fowler-Nordheim tunneling. During flash erasure of floating-gate cells by Fowler-Nordheim tunnelling, the substrate and control gates (wordlines) of each cell are typically connected to 0V, the sources (source lines) of each cell are connected to a positive voltage of perhaps +10V to +15V, and the drains (bitlines) are allowed to float (connected to a high impedance). In the prior-art, tunnelling areas are usually formed between the floating gate and a double-diffused source extending under the floating gate, but separated from the floating gate by a thin gate insulator. In other cases, tunnelling occurs in a window having a thin insulator formed at or near the source.

When using a double-diffused tunnel, the source of each cell is typically formed by an arsenic doping at the same time the drain is doped, followed by a separate mask and phosphorus doping steps, followed by a driving anneal step that causes the phosphorus of the source diffusion to expand under the floating gate to form a tunnelling region. As a result, the floating gate must have sufficient length that the phosphorus diffusion of the source does not reach through (punch-through) to the drain.

The positive voltage applied to the sources (source lines) during erase reverse-biases the P-N junction formed at the N-type source diffusion of each cell and the P-type substrate. That reverse-bias voltage is the cause of undesirable cell-breakdown-voltage problems during flash erase. The cell-breakdown problem is sometimes referred to as the field-plate breakdown of the source to the substrate during erase. The same cell-breakdown problem occurs if a sufficiently large reverse voltage is applied to the drain diffusion.

U.S. Pat. No. 4,924,437 issued May 8, 1990, also assigned to Texas Instruments Incorporated, describes a Fowler-Nordheim method of programming a cell by applying a pulse of about −8V to the control gate together with about +5V applied to the source. While in the majority of nonvolatile-memory-array types, erased cells have floating gates with a neutral or almost neutral charge, in that example erased cells have negatively charged floating gates.

A flash memory using negative wordline erase and triple-well CMOS technology is described in "A 5-V-Only 16-Mb Flash Memory with Sector Erase Mode" by Toshikatsu Jinbo, et al., in Vol. 27, No. 11 of The Journal of Solid-State Circuits, November, 1992 at pages 1547–1553. The array described in that article has sources of "H-type" cells, sometimes called "NOR" cells, (see FIG. 2 of the article) connected to a common node. Each "H-type" cell has a drain implant (see FIG. 3 of the article) for the purpose of lowering the voltage required for hot-carrier-injection programming. Manufacture of the cells described in the article requires extra masking steps that are unnecessary for constructing a usable nonvolatile memory with control logic circuitry using the minimum number of masking steps. "H-type" cells are relatively large when compared to the size of cells, such as "X-type" cells. "X-type" cells are described, for example, in U.S. Pat. No. 4,281,397 issued Jul. 28, 1981, also assigned to Texas Instruments Incorporated. In the past, "X-type" cells have been limited to use in ultraviolet-erasable EPROMs. However, one of the advantages of "X-type" nonvolatile cells is that such cells may be scaled down in size with ongoing improvements in lithographic and processing techniques.

U.S. Pat. No. 5,299,162 issued to Kim et al. on Mar. 29, 1994 describes erasing to negative-threshold-voltage of a selected NAND-type nonvolatile cell by applying 20V to the substrate, source and drain with 0V on the control gate.

There is a need for a nonvolatile-memory array/cell structure that is constructed simultaneously with logic circuitry on the same chip. Such a structure is, for example, useful for controlling data flow into and out of a large-capacity hard-disk drive. Other applications include combination microcontroller/data-storage devices such as electronic cameras, answering machines, and automatic control devices of all kinds. Preferably the cell structure of the memory should use a minimum amount of space, yet be scalable along with the logic structure to take advantage of smaller photolithographic geometries as those capabilities become available. The cell area should be as small as the very small area required by ultraviolet-erasable EPROM cells. In addition, the cell structure should eliminate the problem of field-plate breakdown during flash erase. For flexible application, the memory should be flash-erasable line-by-line using positive voltages.

SUMMARY OF THE INVENTION

The method of this invention includes forming a floating-gate cell, a line of such cells, or an array of such cells, in an isolated well. At the same time, high-voltage and low-voltage logic transistors are formed. As in the prior art, during an erasing operation the source of each memory cell to be erased is driven to a first positive voltage while the control gate is at reference voltage. Using the isolated-well of this invention, the drain and the channel of each cell is also driven to a voltage nearly equal to the first positive voltage by driving the isolated well a second positive voltage that is equal to the first positive voltage, thus eliminating the field-plate breakdown-voltage problem. Because there is no need for a diffused source-junction erase window under the floating gate, each floating-gate cell is a one-transistor cell having roughly the same area as that of an ultra-violet-erasable EPROM cell made using the same technology. Without the prior-art requirement for a separate tunnelling region near the source, a masking step and a phosphorus implant are eliminated. The structure of this invention is, for example, realized in an X-cell memory array that has the small size of an ultra-violet-erasable EPROM and that has manufacturing complexity slightly greater than that of an ultra-violet-erasable EPROM. The high-voltage P-channel transistors and low voltage N-channel transistors of a microcontroller are formed on the chip at the same time the memory cells are formed.

The nonvolatile memory array is encased in a P-well, and the P-well encased in a deep N-well, the two wells separating the memory array from the integrated circuit substrate and from the other circuitry of the integrated circuit. At the same time the deep N-well is formed for the nonvolatile memory array, deep N-wells are formed for the high-voltage P-channel transistors of the logic circuitry. At the same time the P-well is formed for the nonvolatile memory array, P-wells are formed for the low-voltage N-channel transistors.

With the control gate and the integrated circuit substrate at 0V, the deep N-well allows application of a positive erasure voltage of perhaps +16V to the source/drain diffusions and the P-well of the nonvolatile memory array during erasure. Alternatively, with the substrate at 0V, a smaller positive erasure voltage (perhaps +12V) is applied to the source/drain diffusions and the P-well, and a negative erasure voltage (perhaps −6V) is applied to the control gate. Application of those voltages permits the cells of the memory array to be erased without the causing field-plate stress at the p-n junctions between the source/drain diffusions and the P-well.

The term "well" as used herein refers to a relatively large diffusion region formed in a semiconductor substrate. Such diffusion regions are sometimes referred to as "tanks", "tabs" or "moats". The "wells", "tanks", "tubs" or "moats" are generally large enough to contain the diffusion regions and channels of active circuit elements.

The process results in a memory array with rows and columns of cells having a size and structure similar to those of a prior-art ultra-violet-erasable X-type arrays and includes high- and low-voltage logic circuitry on the same chip. The final device combines logic transistors and a memory with a dense flash EPROM circuitry, both formed with the manufacturing ease of that for an ultra-violet-erasable EPROM structure.

BRIEF DESCRIPTION OF THE DRAWINGS

In the drawings:

FIGS. 3(a)–3(k) are elevation views in section of the semiconductor device of FIG. 2, taken along the lines A—A of FIG. 2 at various stages of construction. FIGS. 3(a)–3(k) include exemplary high-voltage and low-voltage transistors not shown in FIG. 2.

DETAILED DESCRIPTION OF THE INVENTION

Figure 1:
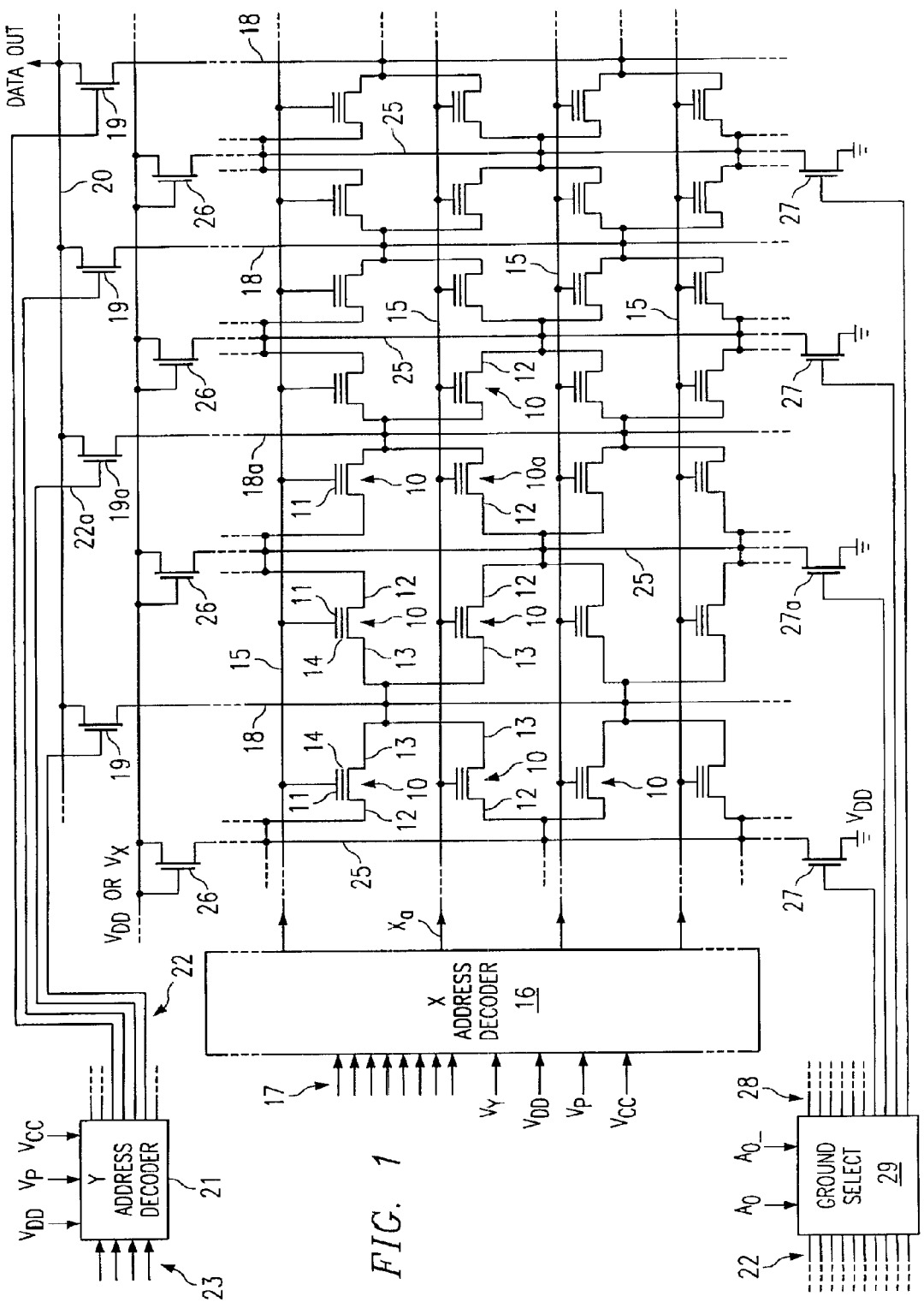
FIG. 1 is a representation in partial block form of an array of memory cells and associated circuitry according to this invention.

Referring to FIG. 1, a memory device is shown which has an array of rows and columns of memory cells 10, each of which is an insulated gate field effect transistor having a control gate 11, a source 12 and a drain 13. The cells 10 include a floating gate 14 between the control gate 11 and the channel between source 12 and drain 13.

The control gates 11 of all cells in each row are connected to one of a set of row lines 15. Row lines 15 are connected to an X address decoder 16 which selects one of row lines 15 based on a row address on lines 17. In a read operation, the selected one of the lines 15 goes high, the others remain low.

The drains 13 of adjacent cells 10 are connected in common to Y output lines 18. The lines 18 are connected through Y output select transistors 19 to a Y output line 20. The gates of the transistors 19 are connected to a Y address decoder 21 via lines 22 which function to apply a supply-level voltage Vcc to one of the lines 22 and hold the others at Vdd based on an address input on lines 23.

The sources 12 of adjacent cells 10 are connected in common to another set of column lines 25 which function as virtual ground lines. Each line 25 is connected through a load device 26 to Vdd or Vx, and is also connected through a column select transistor 27 to ground, or Vdd. The gates of all of these transistors 27 are connected via lines 28 to a ground selector 29 which receives the output lines 22 from the Y address decoder 21, along with the least significant address bit $A_o$ and its complement $A_{o\_}$, and functions to activate only one of the lines 28 for a given Y address.

In the read mode, the X address decoder 16 functions, in response to row line address signals on lines 17 and to a signal from a microprocessor, to apply a preselected positive voltage Vcc (about +3 to +5 volts) to the selected row line Xa (and the selected control gate 11), and to apply a low voltage (Vdd, or ground) to deselected row lines 15. Row line Xa is one of row address lines 15. The Y address decoder 21 functions, in response to column address signals on lines 23, turns transistor 19a on by applying a high voltage on line 22a, causing a sense amplifier (not shown) connected to the DATA OUT terminal to apply a preselected positive voltage Vsen (about +1 to +1.5 volts) to the selected drain-column line 18a. Deselected drain-column lines 18 may be allowed to float (connected to the high impedance of off transistors 19), disconnected from the sense amplifier. The ground select circuit 28 functions to turn transistor 27a on, connecting the particular source-column line 25 to ground (or Vdd). The conductive or nonconductive state of the cell 10a connected to the selected drain-column line 18a and the selected row line Xa is detected by the sense amplifier connected to the DATA OUT terminal.

In a write or program mode, the X address decoder 16 may function, in response to row line address signals on lines 17, and to signals from a microprocessor, to place a preselected first programming voltage Vpp (about +11 to +13V) on a selected row line Xa, including the control-gate conductor 11 of selected cell 10a. Y address decoder 21 also functions to place a second programming voltage Vp (Vpp reduced through an impedance to about +5 to +8V) on a selected drain-column line 18a and, therefore, the drain region 13 of selected cell 10a. Deselected drain-column lines 18 are floated. The selected source-column line 25 is connected to reference potential Vdd. Deselected source-column lies 25 are charged through transistors 26 to a sufficient voltage Vx that prevents deselected cell 10b from programming. Deselected row lines are connected to a stress-reducing voltage Vy. These programming voltages create a high current (drain 13 to source 12) condition in the channel of the selected memory cell 10a, resulting in the generation near the source-channel junction of channel-hot electrons and/or avalanche-breakdown electrons (hot carriers) that are injected across the channel oxide to the floating gate 14 of the selected cell 10a. The programming time is selected to be sufficiently long to program the floating gate 14 with a negative program charge of about −2V to −6V with respect to the channel region. The electrons injected into the floating gate 14, in turn, render the source-drain path under the floating gate 14 of the selected cell 10a nonconductive, a state which is read as a "zero" bit. Deselected cells 10 have source-drain paths under the floating gates 14 that remain conductive, and those cells 10 are read as "one" bits.

During the program and read operation examples described above, cells 10 located in P-wells 31 and N-wells 33 (see FIG. 2) are programmed and erased with the P-wells 31 and N-wells 33 at 0V.

Figure 2:
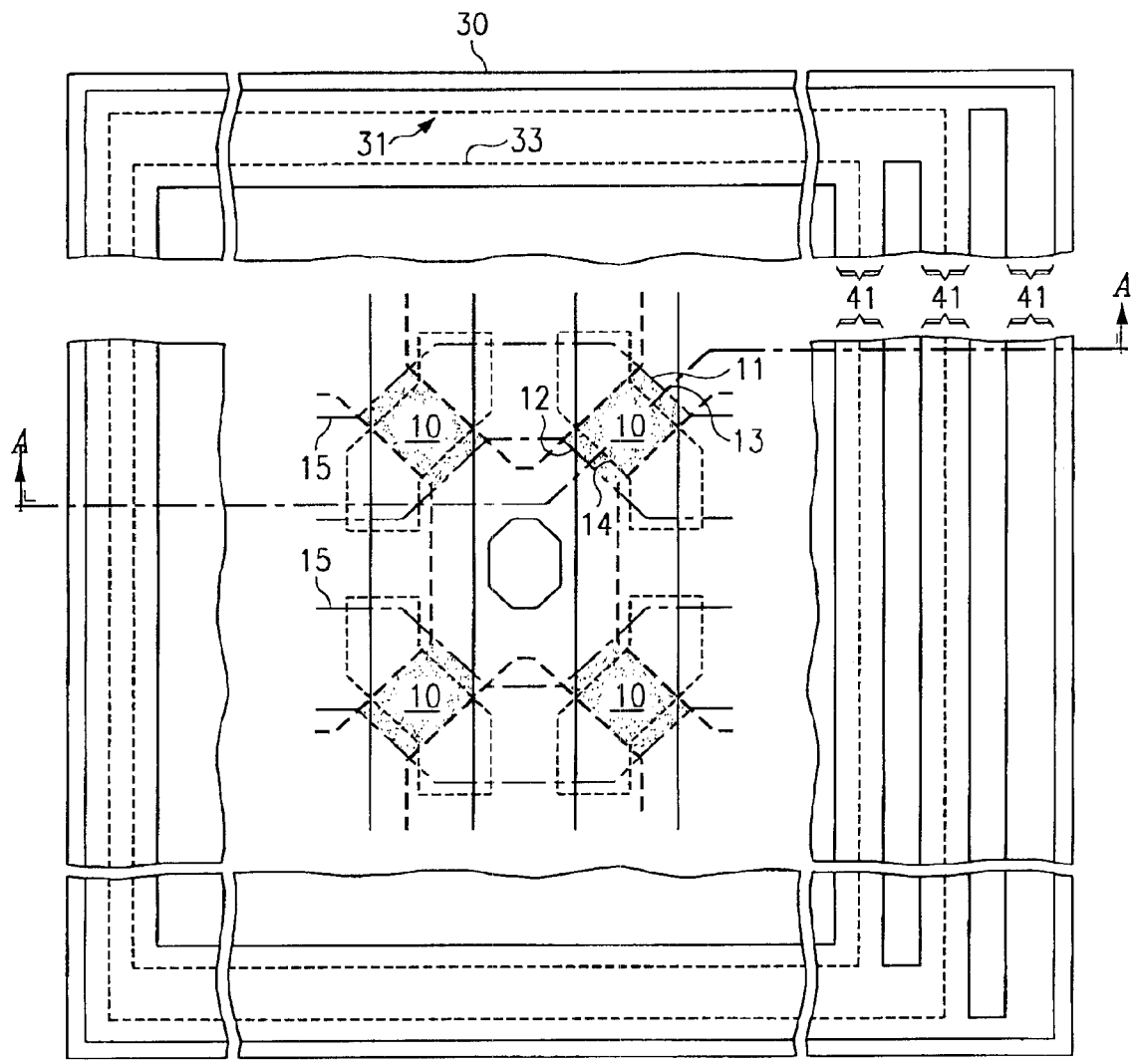
FIG. 2 is a plan view of a part of the part of a semiconductor chip having memory cells in a double tank according to one embodiment.

With the substrate and the row-lines 15/control-gates 11 at reference voltage Vdd or 0V, erasing is accomplished by applying a positive voltage Vpp (perhaps +18V) to the P-well 31 and the N-well 33 (see FIG. 2). The source 12, drain 13 and channel of each cell 10 may float or may also be connected to the positive voltage Vpp. With this voltage between control gates 11 and sources-12-channels-drains-13, the negative charge is removed from the floating gates 14 of programmed cells 10. If all of the cells 10 in the array are in one well and all are erased at the same time, a "flash" erase is performed. If sectors of cells 10 are formed in separate P-wells 31 and N-wells 33, each sector may be flash erased separately.

The terms "source" and "drain", as used herein, are interchangeable. For example, the voltages applied to the source 12 regions and the drain 13 regions of the memory cells 10 may be interchanged in the read example above.

For convenience, a table of read and write voltages is given in the Table below:

A method of making the devices of FIG. 1 will be described in reference to FIGS. 2 and 3($a$)–3($k$). The method description relates only to the process for forming an X-cell array of cells 10 and for forming both the high-voltage P-channel transistors HVT and low-voltage N-channel transistors LVT of the logic circuitry of logic circuitry on the same chip. While logic circuitry normally includes high-voltage N-channel transistors HVT and low-voltage P-channel transistors LVT, the additional steps used to form such high-voltage N-channel transistors HVT and low-voltage P-channel transistors LVT are not included in the following discussion.

The starting material is p-epi on a slice of p+ substrate 30, only a very small portion shown in the FIGS. The slice is perhaps 8 inches in diameter, while the portion shown in FIG. 2 is very small fraction of that slice. A pad oxide PO of about 400 Angstroms is grown on the surface.

Referring now to FIGS. 3($a$), and 3($b$) deep N-wells 31 are formed in the substrate 30 using the following process. Deep N-wells 31 are patterned with photoresist PR. The length and width of the implant area in the region where the memory cells 10 are to be formed must be sufficiently large that the dimensions encase a P-well 33 which in turn encases the memory array (or subarray). The length and the width of each implant area in the region where a high-voltage P-channel transistor HVT is to be formed must be sufficiently large that the dimensions encase the source 12 and drain 13 of each of that transistor HVT. The N-well 31 implant is then conducted, preferably with phosphorus P at a dose of about $4.0 \times 10^{12}$ ions/cm$^2$ and at an energy level of about 80 KeV. The photoresist is then stripped. An anneal of the N-well 31 dopant is performed at high temperature, perhaps 1200° C. for 700 minutes in a nitrogen atmosphere, to form a junction perhaps 7 microns deep. This completes creation of deep N-well regions 31. The implantation defines the channel regions of high-voltage P-channel transistors HVT.

Referring now to FIG. 3($c$) and 3($d$), P-wells 33 are formed in each N-well 31 where the memory is to be formed and in each region where a low-voltage N-channel. transistor LVT is to be formed. The P-wells 33 are patterned with a photoresist layer PR and a P-type implant is performed, preferably with boron B at a dose of about $6.0 \times 10^{12}$ ions/cm$^2$ and an energy of approximately 40 KeV. In regions where the memory array is to be formed, the length and width of the pattern must be sufficiently small to allow the P-well 33 to be encased by the deep N-well 31, but sufficiently large to encase the memory array (or sub-array). The depth of P-well 33 must not exceed the depth of N-well 31. The length and the width of each implant area in the region where a low-voltage N-channel transistor LVT is to be formed must be sufficiently large that the dimensions encase the source 12 and drain 13 of each transistor LVT. The implantation, defines the channel Ch regions of the memory cells 10 and of low voltage transistors LVT. The photoresist layer is then stripped. An anneal of the P-well 33 dopant is performed at high temperature, perhaps 1100° C. for about 500 minutes in a nitrogen atmosphere, to form a junction perhaps 2 microns deep.

Referring to FIG. 3($e$), further processing is described. A conventional nitride/oxide masking layer NOM is deposited and patterned to define oxide regions 41. Oxide regions 41 are grown by localized oxidation (LOCOS) to a thickness in the range of about 6300 to 7800 Angstroms (the thicknesses of the sections shown in FIGS. 3($e$)–3($k$) not being to scale). The growth occurs under an oxidizing atmosphere such as steam for about 120 minutes at about 900° C. The thermal oxide grows beneath the edges of the mask, creating a "bird's beak" instead of a sharp transition. The masking layers are removed using a hydrofluoric acid dip for two minutes and using hot phosphoric acid at about 177° C. for about 45 minutes After a cleanup step, a pre-gate oxide layer (not shown) is grown on the exposed silicon surface to a thickness of about 300 Angstroms.

At this point, a threshold-voltage-adjust implant may be performed in active areas including where channels Ch of memory cells 10 are to be located, those areas patterned using photoresist. For example, boron may be implanted in the memory cell regions at a dose in about the range of about $4 \times 10^{12}$ to $9 \times 10^{12}$ ions/cm$^2$ and at an energy level of about 40 KeV. The photoresist is stripped and the oxide over the active areas is stripped.

Referring to FIG. 3($f$), oxide is regrown over the structure using conventional techniques to form a relatively thin gate insulator layer 43 approximately 105 Angstroms thick. A first polycrystalline silicon layer ("poly 1") 14 about 1500 Angstroms thick, which will become floating gates of memory cells 10 is deposited over the face and is doped to be N+ using phosphorus. The first polysilicon layer 14 is patterned with a photoresist and strips are etched to partially form what will be floating gates of the memory cells 10. At the same time, the first polysilicon layer 14 is removed form the region where logic transistors such as high-voltage P-channel transistors HVT and low-voltage N-channel transistors LVT are to be formed. This step is followed by a photoresist strip and clean-up.

Referring again to FIG. 3($f$), inter-level insulator layer 45 is then formed over the structure in the areas where memory cells 10 are to be formed. Inter-level insulator layer 45 may be formed by growing an oxide layer to about 150 Angstroms, then depositing a nitride layer about 195 Angstroms thick. The equivalent oxide thickness of the inter-level insulator may be about 200 Angstroms. The poly1 and inter-level insulator are etched. The patterned photoresist for this step is stripped.

Referring again to FIG. 3($f$), a second polycrystalline silicon layer ("poly 2") 15 about 4500 Angstroms thick, which will become control gates/row lines of the memory array and the gates of high-voltage P-channel transistors HVT and low-voltage N-channel transistors LVT of the logic circuitry, is then deposited over the face of the slice and is highly doped with phosphorus to be N+.

Referring to FIG. 3($g$), after de-glazing and patterning with photoresist, the gates of high-voltage P-channel transistors HVT and low-voltage N-channel transistors LVT of the logic circuitry are etched in the logic area of the chip. After again patterning with photo resist, a stack etch of (i) the second polysilicon layer 11,15, (ii) the inter-level insulator layer 45, and (iii) the first polysilicon strips 14 is performed in the memory area of the chip. This stack etch defines a plurality of elongated control gates II/row lines 15. The row lines 15 connect rows of memory cells 10. This same stack etch separates and defines the remaining edges of the floating gates 14.

Figure 3E:
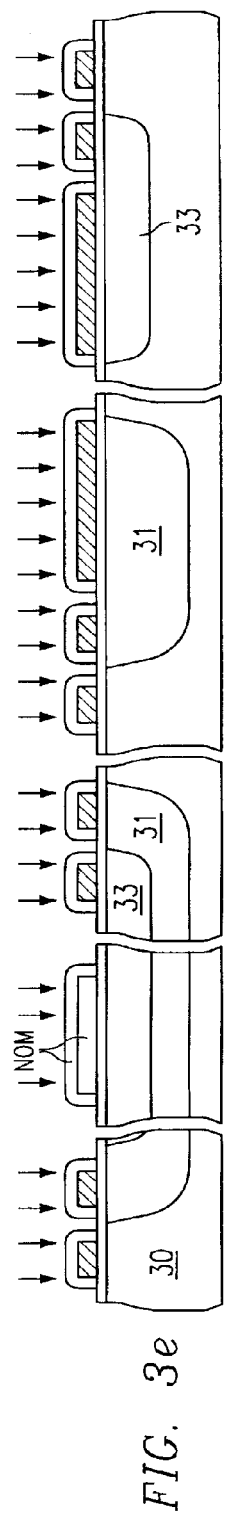
Figure 3F:
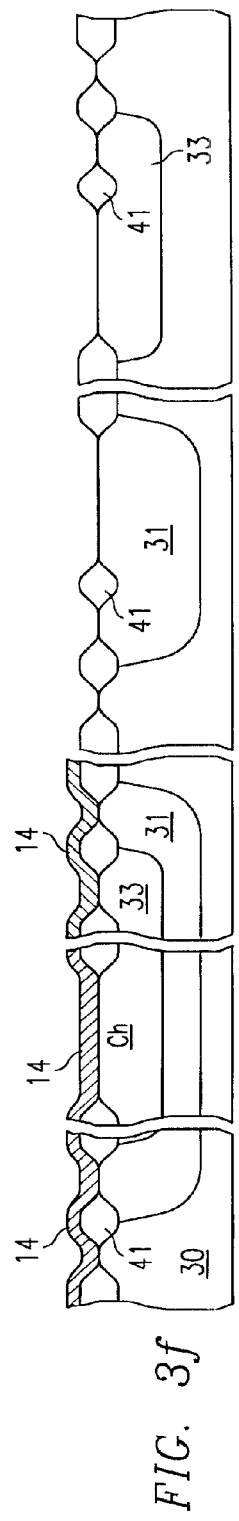
Figure 3G:
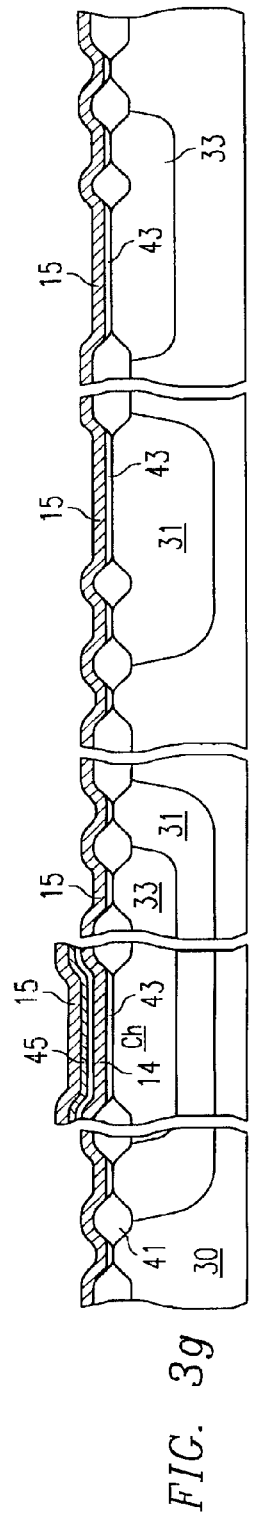
Figure 3H:
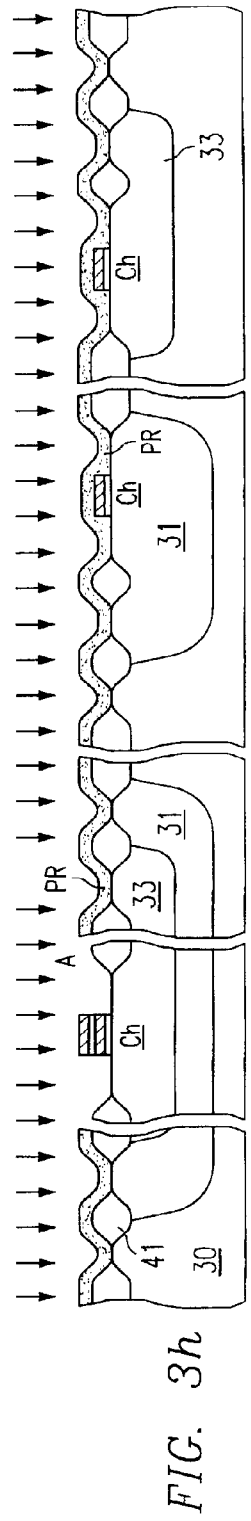

Referring now to FIG. 3(h), a photoresist layer PR is deposited and patterned to open a window over the entire flash array. An arsenic implant A is performed at a dosage of about $5\times10^{15}$ ions/cm$^2$ at 120 KeV at zero degrees to the normal to create the sources 12 and drains 13 of memory cells 10.

Figure 3I:
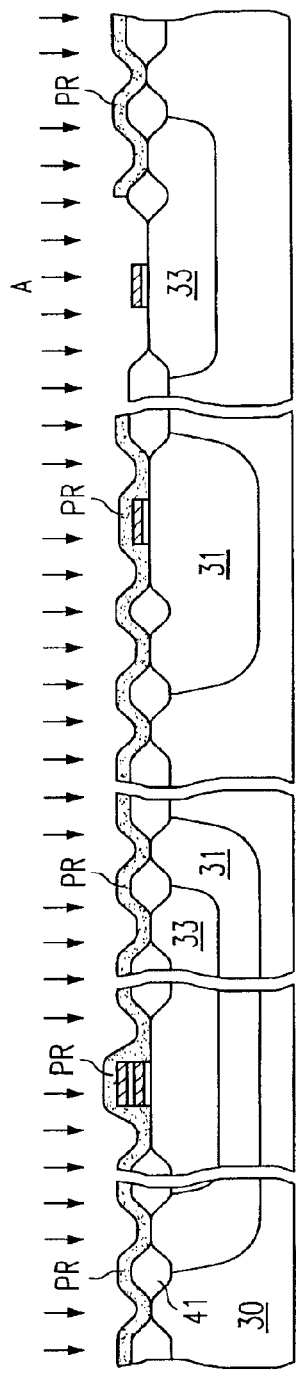

Referring to FIG. 3(i), an arsenic implant A is performed at a dosage of about $3\times10^{15}$ ions/cm$^2$ at 120 KeV, using photoresist PH to protect areas of the chip not implanted, to create the sources 12 and drains 13 of the low-voltage N-channel transistors LVT.

Figure 3J:
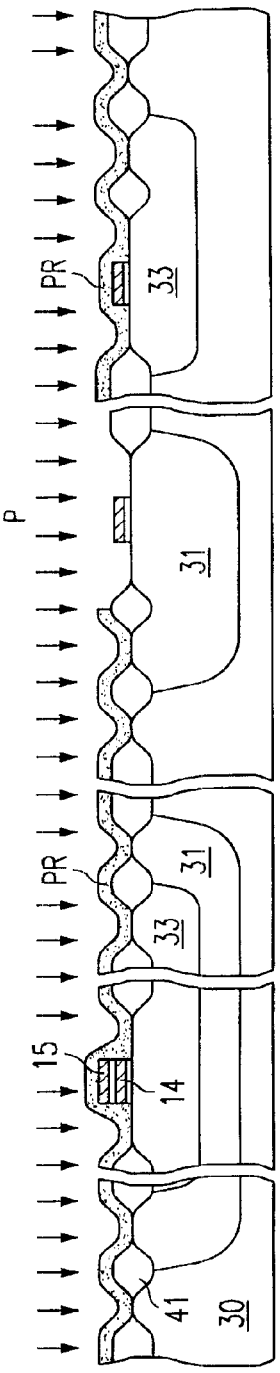

Referring to FIG. 3(j), a phosphorus implant P is performed at a dosage of about $4\times10^{14}$ ions/cm$^2$ at 20 KeV, using photoresist PR to protect areas of the chip not implanted, to create the sources 12 and drains 13 of the high-voltage P-channel transistors HVT.

Figure 3K:
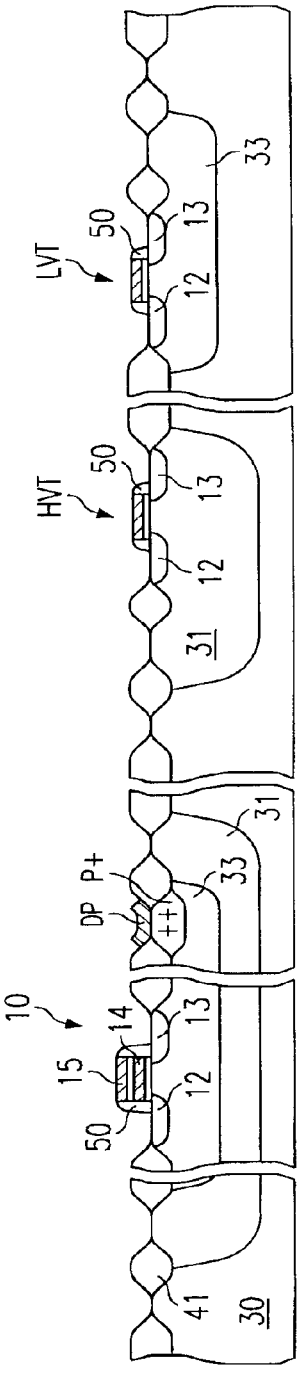

Referring to FIG. 3(k), the dopants of memory cells 10, of low-voltage N-channel transistors LVT and high-voltage P-channel transistors HVT are driven with an anneal step at perhaps 900° C. for 20 minutes to complete formation of sources 12 and drains 13. Oxide is deposited or grown and removed in conventional manner to form sidewall spacers SO.

A cap oxide (not shown) about 300 Angstroms thick is deposited over the surface. A borophosphosilicate glass (BPSG) layer (not shown) may then be deposited over the face of the slice. Following the BPSG deposition, the substrate 30 is heated again at about 900° C. for about one hour in an annealing ambient to provide BPSG densification, repair implant damage and junction profile drive. Column lines 18 and 25 are formed from a layer or aluminum after etching holes to sources 12 and drains 13 and other place on the chip where connection is desired. At the same time that column lines 18 and 25 are formed, other conductors are formed for logic circuitry. Off-array contacts for both memory and logic are masked and etched through the BPSG layer.

One problem with an isolated P-well 33 is high well resistance. The high well resistance causes a significant voltage drop during programming. The voltage drop is decreased by implant a P-type impurity P+ in the contact areas to P-well 33. The contact areas should be strips, preferably extending along at least one side of each P-well 33.

Metal is deposited, masked and etched to form metal lines to respective diffused regions, such as terminals 36 and 37 and the substrate terminal indicated Vdd. (The contact to P-well 33 may include a layer of previously-deposited doped polysilicon DP to decrease resistance.) This is followed by a protective overcoat process.

The invention described herein is usable with many other types of floating-gate memory cell arrays.

While the invention has been described with reference to an illustrative embodiment, this description is not meant to be construed in a limiting sense. Various modifications of the illustrative embodiment, as well as other embodiments of the invention, will be apparent to persons skilled in the art upon reference to this description. it is, therefore, contemplated that the appended claims will cover any such modifications or embodiments that fall within the true scope of the invention.

We claim:

1. A method for making a nonvolatile, floating-gate memory with logic transistors in a face of a semiconductor body, comprising the steps of:

forming first and second opposite-conductivity-type diffusion regions having a first depth in said semiconductor body, said first and second opposite-conductivity-type diffusion regions doped to have primarily a second conductivity-type opposite said first conductivity-type;

forming first and second same-conductivity-type diffusion regions having a second depth in said semiconductor body, said first same-conductivity-type diffusion region encased in said first opposite-conductivity-type diffusion region, said second same-conductivity-type region separate from said first and second opposite-conductivity-type diffusion regions, said first and second same-conductivity-type diffusion regions doped to have primarily said first conductivity-type;

forming at least one floating-gate memory cell in and on said first same-conductivity-type diffusion region;

forming at least one high-voltage logic transistor in said second opposite-conductivity-type diffusion region; and forming at least one low-voltage logic transistor in said second same-conductivity-type diffusion region.

2. The method according to claim 1, wherein said semiconductor body is silicon of P conductivity-type, said first and second opposite-conductivity-type diffusion regions are primarily of N conductivity-type and said first and second same-conductivity-type diffusion regions are primarily of P conductivity-type.

3. The method according to claim 1, wherein said first opposite-conductivity-type diffusion region and said first same-conductivity-type diffusion region are connected to a positive potential with respect to the potential of said semiconductor body during erasure of said floating-gate memory cell.

4. The method according to claim 1, wherein Fowler-Nordheim tunnelling is used to program said floating gates of memory cells.

5. The method according to claim 1, wherein said floating-gate memory cell is part of an X-cell memory array having single-dopant sources and drains.

6. The method according to claim 1, further including formation of field oxide regions on the surface of said semiconductor substrate, said field oxide regions formed over the edges of said diffusion regions.

7. The method according to claim 1, further including formation of field oxide regions on the surface of said semiconductor substrate, said field oxide regions formed over the edges of said diffusion regions and formed within said diffusion regions surrounding at least one connection point.

8. The method according to claim 1, further including formation of field oxide regions on the surface of said semiconductor substrate, said field oxide regions formed to surround connection points to said diffusion regions, said first opposite-conductivity-type diffusion region and said first same-conductivity-type diffusion regions having multiple connection points at the periphery of said diffusion regions.

9. The method according to claim 1, further including formation of diffused contacts in said first same-conductivity-type diffusion region, wherein said diffused contacts include additional doping of said same-conductivity-type.

10. The method according to claim 1, further including formation of diffused contacts in said first same-conductivity-type diffusion region, wherein said diffused contacts are connected to doped polysilicon.

* * * * *